US008541750B2

(12) United States Patent
Chen et al.

(10) Patent No.: US 8,541,750 B2
(45) Date of Patent: Sep. 24, 2013

(54) X-RAY DETECTOR AND FABRICATION METHOD THEREOF

(75) Inventors: Yu-Cheng Chen, Hsin-Chu (TW); An-Thung Cho, Hsin-Chu (TW); Ching-Sang Chuang, Hsin-Chu (TW); Chia-Tien Peng, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 1056 days.

(21) Appl. No.: 12/553,982

(22) Filed: Sep. 3, 2009

(65) Prior Publication Data
US 2010/0207033 A1    Aug. 19, 2010

(30) Foreign Application Priority Data
Feb. 18, 2009 (TW) ................ 98105087 A

(51) Int. Cl.
*G01T 1/20* (2006.01)
(52) U.S. Cl.
USPC ............ 250/370.11; 250/370.08; 250/370.09; 250/370.14; 438/96; 257/57
(58) Field of Classification Search
USPC ..................................... 250/370.11
See application file for complete search history.

(56) References Cited

U.S. PATENT DOCUMENTS

| | | | | |
|---|---|---|---|---|
| 5,262,649 A * | 11/1993 | Antonuk et al. | ......... | 250/370.09 |
| 5,539,461 A * | 7/1996 | Andoh et al. | ................. | 348/308 |
| 5,994,157 A * | 11/1999 | Aggas et al. | ..................... | 438/30 |
| 6,020,590 A * | 2/2000 | Aggas et al. | ............. | 250/370.09 |
| 6,021,173 A * | 2/2000 | Brauers et al. | ................ | 378/98.8 |
| 6,121,622 A * | 9/2000 | Beyne et al. | .................... | 250/374 |
| 6,288,435 B1 * | 9/2001 | Mei et al. | ....................... | 257/458 |
| 6,323,490 B1 * | 11/2001 | Ikeda et al. | ............. | 250/370.09 |
| 6,396,046 B1 * | 5/2002 | Possin et al. | ............... | 250/208.1 |
| 6,489,213 B1 * | 12/2002 | Hsueh et al. | .................. | 438/382 |
| 7,006,598 B2 * | 2/2006 | Morii et al. | ..................... | 378/97 |
| 7,023,503 B2 | 4/2006 | den Boer | | |
| 7,034,309 B2 * | 4/2006 | Mochizuki | .............. | 250/370.09 |
| 7,214,945 B2 * | 5/2007 | Nomura et al. | .......... | 250/370.08 |
| 7,231,018 B2 * | 6/2007 | Morii et al. | ..................... | 378/97 |
| 7,368,724 B2 * | 5/2008 | Morii et al. | .............. | 250/370.01 |
| 7,468,531 B2 * | 12/2008 | Watanabe et al. | ............. | 257/291 |
| 7,521,684 B2 * | 4/2009 | Nomura et al. | .......... | 250/370.09 |
| 7,723,136 B2 * | 5/2010 | Watanabe et al. | .............. | 438/30 |
| 7,829,858 B2 * | 11/2010 | Mochizuki et al. | ...... | 250/370.01 |
| 8,067,743 B2 * | 11/2011 | Ishii et al. | .............. | 250/370.09 |
| 8,164,065 B2 * | 4/2012 | Mochizuki et al. | ...... | 250/370.11 |
| 2001/0008271 A1 * | 7/2001 | Ikeda et al. | ............. | 250/370.09 |
| 2002/0145117 A1 * | 10/2002 | Mochizuki | .............. | 250/370.09 |
| 2004/0159794 A1 * | 8/2004 | Morii et al. | .............. | 250/370.11 |
| 2004/0251421 A1 * | 12/2004 | Kobayashi et al. | ...... | 250/370.09 |
| 2005/0145800 A1 * | 7/2005 | Mochizuki | .............. | 250/370.09 |
| 2006/0043517 A1 | 3/2006 | Sasaki et al. | | |

(Continued)

FOREIGN PATENT DOCUMENTS
WO    2007086292 A1    8/2007

*Primary Examiner* — David Porta
*Assistant Examiner* — Djura Malevic
(74) *Attorney, Agent, or Firm* — Winston Hsu; Scott Margo

(57) ABSTRACT

A structure of X-ray detector includes a Si-rich dielectric material for serving as a photo-sensing layer to increase light sensitivity. The fabrication method of the X-ray detector including the Si-rich dielectric material needs less photolithography-etching processes, so as to reduce the total thickness of thin film layers and decrease process steps and cost.

32 Claims, 13 Drawing Sheets

(56) References Cited

U.S. PATENT DOCUMENTS

| | | | |
|---|---|---|---|
| 2006/0062352 A1* | 3/2006 | Nomura et al. | 378/98.8 |
| 2007/0045554 A1 | 3/2007 | Wakamatsu et al. | |
| 2007/0114625 A1* | 5/2007 | Hsiao et al. | 257/431 |
| 2007/0152220 A1* | 7/2007 | Kwack | 257/59 |
| 2008/0067324 A1* | 3/2008 | Heiler et al. | 250/208.1 |
| 2008/0153039 A1* | 6/2008 | Akimoto | 430/313 |
| 2008/0182349 A1* | 7/2008 | Yamazaki et al. | 438/29 |
| 2009/0224162 A1* | 9/2009 | Inuiya et al. | 250/370.09 |
| 2010/0219413 A1* | 9/2010 | Morisue et al. | 257/59 |
| 2010/0248405 A1* | 9/2010 | Tanaka | 438/34 |
| 2010/0289026 A1* | 11/2010 | Yamazaki et al. | 257/59 |
| 2011/0027920 A1* | 2/2011 | Yamazaki et al. | 438/23 |
| 2011/0031497 A1* | 2/2011 | Yamazaki et al. | 257/59 |
| 2011/0210451 A1* | 9/2011 | Gambee et al. | 257/774 |
| 2012/0028391 A1* | 2/2012 | Tanaka | 438/34 |
| 2012/0045894 A1* | 2/2012 | Yamazaki et al. | 438/652 |

\* cited by examiner

X-RAY DETECTOR AND FABRICATION METHOD THEREOF

BACKGROUND OF THE INVENTION

1. Field of the Invention

The present invention is related to an X-ray detector and a fabrication method of X-ray detector, and more particularly, to an X-ray detector by utilizing a silicon-rich (Si-rich) dielectric layer as photo-sensing material and a fabrication method thereof.

2. Description of the Prior Art

In contrast to the traditional negative-type X-ray detector system, a digital X-ray flat indirect detector system has advantages of low irradiation and fast imaging of electric images. In addition, the images of digital X-ray flat indirect detector system is easily to be viewed, reformed, extracted, transferred, and analyzed. Therefore, the digital X-ray flat indirect detector system has been a mainstream in current medical digital image technology. A digital X-ray flat indirect detector system includes a sensing pixel array, and each sensing pixel includes a thin film transistor (TFT), a photo-sensing device and a luminous material that transforms X-ray into visible light. Generally, the photo-sensing devices of a traditional digital X-ray flat indirect detector system are mainly formed with P-type/intrinsic/N-type (PIN) photodiodes that are composed of amorphous silicon materials. However, a PIN photodiode has a very large thickness, which is about 1-2 micrometers (μm), and is conductive itself. Therefore, many isolation layers have to be formed around the PIN photodiode in order to avoid short defect occurring between the PIN photodiode and adjacent devices, such as sensing electrodes. As a result, the fabrication process that integrates the PIN photodiodes and the sensing pixel array having devices such as TFTs usually includes 12 to 13 steps of thin-film deposition processes and photolithography-etching processes, which spends a lot of time and costs much money. Accordingly, it is still an important issue for manufacturers of X-ray detector system to keep on researching in order to design new structure or new photo-sensing materials that can effectively replace PIN photodiodes for fabricating digital X-ray flat indirect detector system through simple processes.

SUMMARY OF THE INVENTION

It is one of the objectives of the present invention to provide an X-ray detector by utilizing Si-rich dielectric material to form photo-sensing devices, such that the above-mentioned problems of complex fabrication process and high cost of the traditional X-ray detector resulting from integrating the fabrication process of PIN photodiode and TFT elements can be solved.

The present invention provides a fabrication method of X-ray detector. According to the fabrication method, a substrate comprising a photo-sensing area is provided, and a patterned first conductive layer is formed on the substrate. The patterned first conductive layer comprises at least a gate positioned in the photo-sensing area. Then, a gate insulating layer is formed on the substrate to cover the surface of the gate. After that, a patterned semiconductor layer and a patterned second conductive layer are successively formed on the surface of the gate insulating layer, wherein the patterned semiconductor layer comprises a semiconductor channel region disposed on the surface of the gate insulating layer above the gate, and the patterned second conductive layer comprises a source and a drain disposed on the patterned semiconductor layer and at two sides of the semiconductor channel region respectively. Following that, a patterned dielectric layer is formed on the substrate, and the patterned dielectric layer has at least a first via hole that exposes a portion of the drain. A patterned third conductive layer is formed on the substrate, which comprises a bottom sensing electrode positioned in the photo-sensing area and is electrically connected to the drain through the first via hole. The patterned third conductive layer is positioned above the patterned semiconductor layer. A patterned Si-rich dielectric layer is formed on the substrate, disposed on the surface of the bottom sensing electrode. Then, a patterned transparent conductive layer is formed on the substrate. The patterned transparent conductive layer comprises at least a top sensing electrode covering the patterned Si-rich dielectric layer. A passivation layer is then formed on the substrate to cover the patterned transparent conductive layer. Finally, a scintillator layer is formed above the substrate and the passivation layer. The scintillator layer corresponds to the patterned Si-rich dielectric layer.

The present invention further provides an X-ray detector that comprises: a substrate comprising a photo-sensing area; a patterned first conductive layer disposed on the substrate, which comprises at least a gate positioned in the photo-sensing area; a gate insulating layer disposed on the substrate and covering the gate; a patterned semiconductor layer disposed on the surface of the gate insulating layer above the gate and comprising a semiconductor channel region; a patterned second conductive layer comprises at least a source and a drain disposed on the patterned semiconductor layer and positioned at two sides of the semiconductor channel region respectively; a dielectric layer disposed on the surface of the substrate and covering a portion of the patterned second conductive layer and the semiconductor channel region, wherein the dielectric layer has a first via hole that exposes a portion of the drain; a patterned third conductive layer that comprises a bottom sensing electrode positioned in the photo-sensing area, wherein the bottom sensing electrode is disposed on the patterned semiconductor layer and electrically connected to the drain through the first via hole; a patterned Si-rich dielectric layer disposed on the bottom sensing electrode; a patterned transparent conductive layer comprises a top sensing electrode disposed on the surface of the patterned Si-rich dielectric layer; a passivation layer covering the patterned transparent conductive layer; and a scintillator layer disposed above the passivation layer, corresponding to the patterned Si-rich dielectric layer.

The present invention even further provides a fabrication method of an X-ray detector. First, a substrate comprises a photo-sensing area is provided, and a TFT including a gate, a gate insulating layer, a patterned semiconductor layer, a source, and a drain is formed on the substrate. Then, a dielectric layer is formed on the substrate, which comprises at least a first via hole that exposes a portion of the drain. A patterned third conductive layer is formed on the substrate, wherein the patterned third conductive layer comprises a bottom sensing electrode positioned in the photo-sensing area and electrically connected to the drain through the first via hole. The patterned third conductive layer is disposed above the patterned semiconductor layer. Sequentially, a patterned Si-rich dielectric layer is formed on the substrate, which is disposed on the surface of the bottom sensing electrode. A patterned transparent conductive layer is then formed on the substrate, which comprises at least a top sensing electrode covering the patterned Si-rich dielectric layer. Finally, a passivation layer is formed on the substrate to cover the patterned transparent conductive layer, and a scintillator layer is formed above the substrate, disposed on the passivation layer. The scintillator layer corresponds to the patterned Si-rich dielectric layer.

It is an advantage that the X-ray detector of the present invention utilizes Si-rich dielectric materials as its photo-sensing material, such that additional dielectric layers or isolation layers are no needed to be formed for isolating the patterned Si-rich dielectric layer. Therefore, the fabrication process and cycle time can be saved. In addition, the thickness of the patterned Si-rich dielectric layer may be less than 0.5 um, which reduces the whole thickness of the X-ray detector that has several thin films and the raw material cost.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
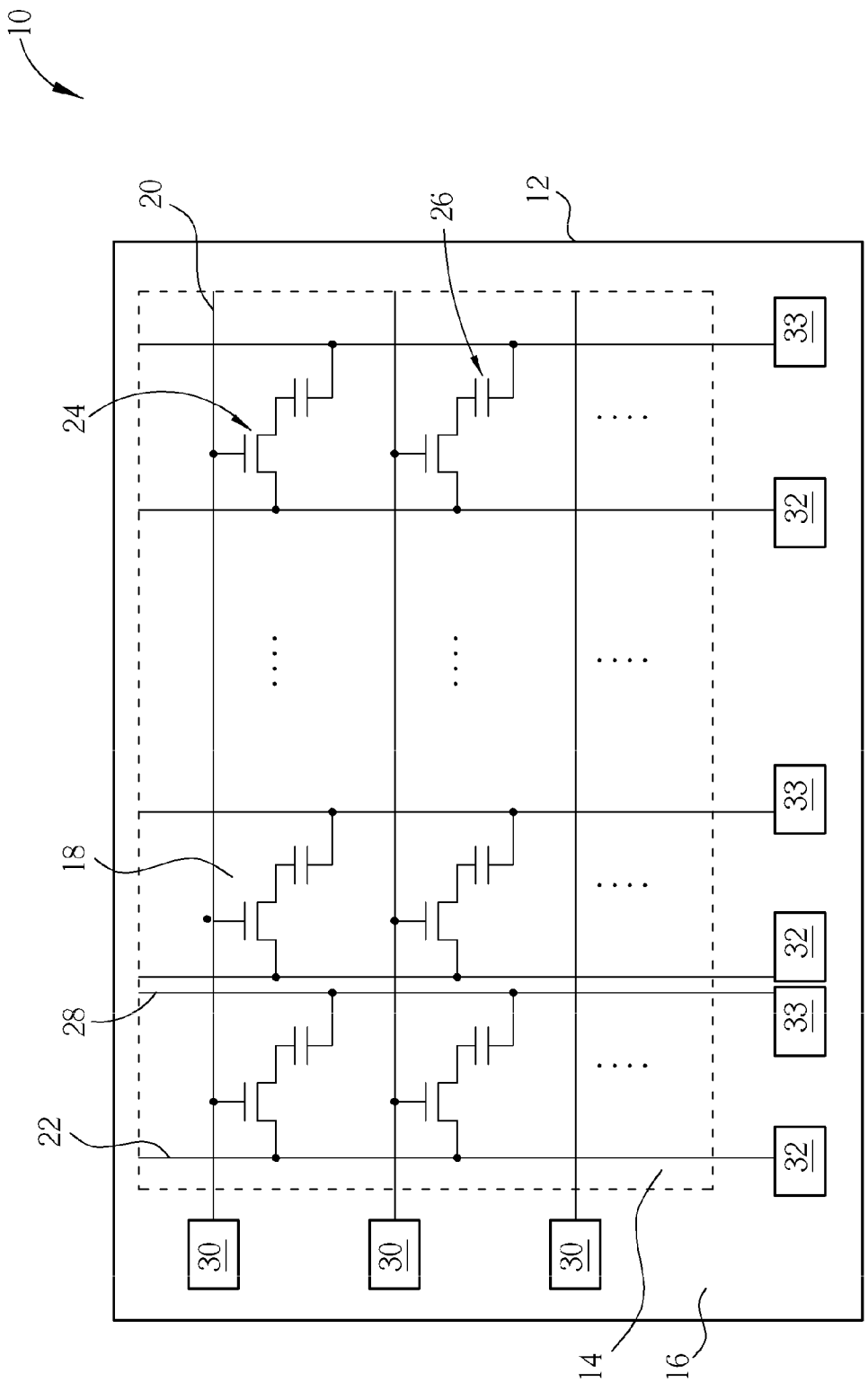
FIG. 1 is a schematic diagram of the equivalent circuit layout of an X-ray detector according to the present invention.

With reference to FIG. 1, FIG. 1 is an equivalent circuit layout diagram of an X-ray detector 10 according to the present invention. The X-ray detector 10 of the present invention comprises a substrate 12, wherein a photo-sensing area 14 and a periphery area 16 at a side of the photo-sensing area 14 are disposed thereon. The photo-sensing area 14 comprises a plurality of sensing pixels 18 arranged as an array, which are defined by pluralities of scan lines 20 and readout lines 22 perpendicular to the scan lines 20. Each sensing pixel 18 includes at least a TFT 24 and a photo-sensing device 26. The substrate 12 further comprises a plurality of top electrode lines 28 parallel to the readout lines 22, each of which individually passes through pluralities of sensing pixels 18 and is electrically connected to the top sensing electrodes of the photo-sensing devices 26 in the sensing pixels 18 it passes through. On the other hand, a plurality of first contact pads 30 and a plurality of second contact pads 32 are disposed in the periphery area 16, wherein the first contact pads 30 may be electrically connected to the scan lines 20 and the second contact pads 32 may be electrically connected to the readout lines 22. A plurality of third contact pads 33 may be selectively disposed in the periphery area 16 and electrically connected to the top electrode lines 28.

Figure 2:
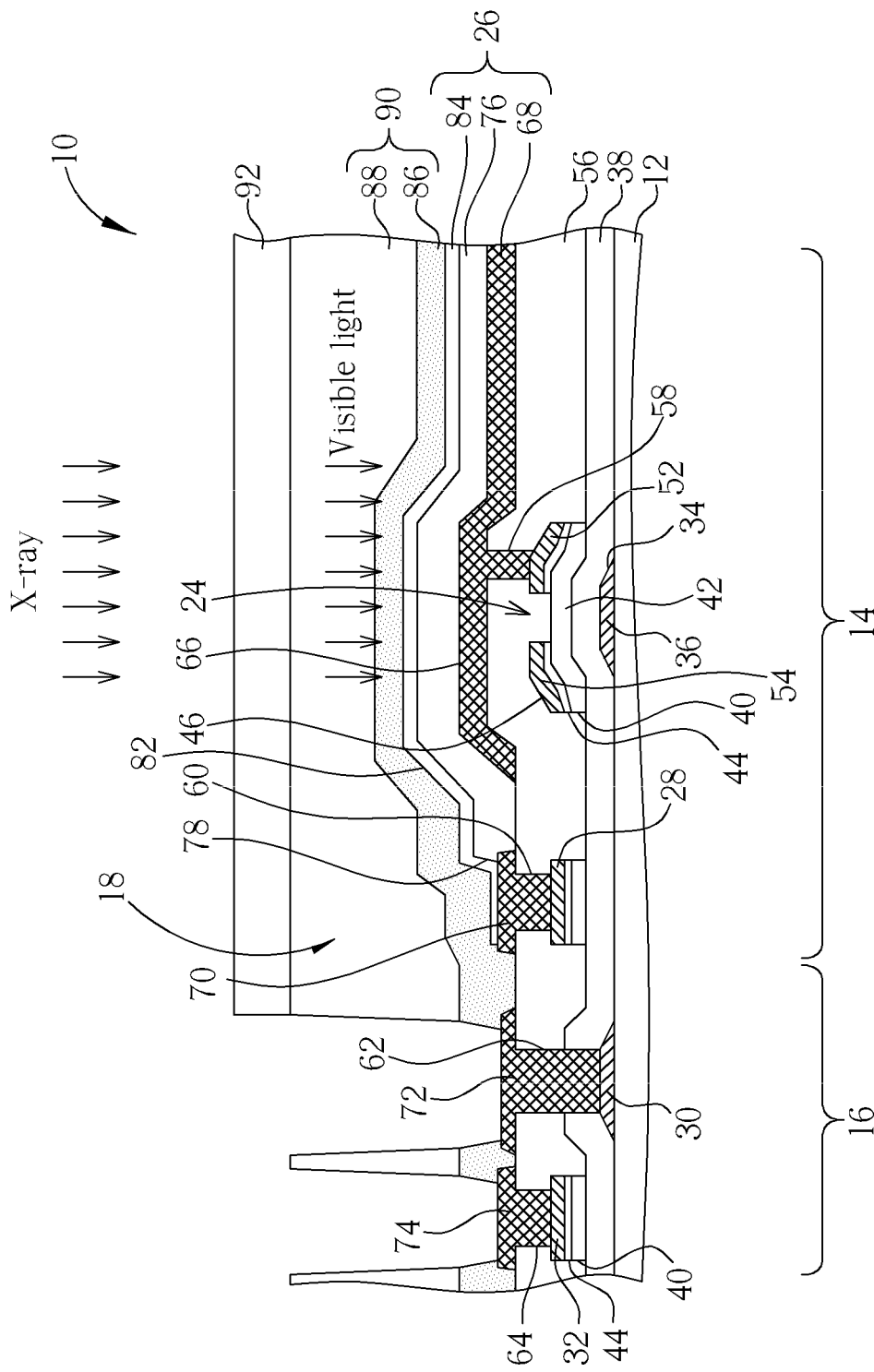
FIG. 2 is a partial sectional schematic diagram of the X-ray detector of the present invention shown in FIG. 1.

Referring to FIG. 2, FIG. 2 is a sectional schematic diagram of the partial X-ray detector 10 of the present invention shown in FIG. 1, wherein only one sensing pixel 18 is shown in FIG. 2 for illustration. The X-ray detector 10 of the present invention comprises a patterned first conductive layer 34 disposed on the surface of the substrate 12. The first conductive layer 34 includes a gate 36 of the TFT 24 of each sensing pixel 18 and the first contact pads 30 positioned in the periphery area 16 (only one first contact pad 30 is shown in FIG. 2). The X-ray detector 10 further comprises a gate insulating layer 38 disposed on the surface of the substrate 12 and covering the gate 36 and a portion of the first contact pad 30. A patterned semiconductor layer 40 is disposed on the gate insulating layer 38 and comprises a semiconductor channel region 42 disposed on the surface of the gate insulating layer 38 above the gate 36. The patterned semiconductor layer 40 may comprise amorphous silicon materials.

In addition, the X-ray detector 10 comprises a patterned second conductive layer 46 disposed on the gate insulating layer 38, covering a portion of the patterned semiconductor layer 40. A patterned doped semiconductor layer 44 may be selectively disposed between the patterned semiconductor layer 40 and the patterned second conductive layer 46, which may be composed of doped amorphous silicon materials for example. The patterned second conductive layer 46 comprises at least a drain 52, a source 54, a top electrode line 28, a second contact pad 32, and a third contact pad 33 (shown in FIG. 1). Wherein, the drain 52 and the source 54 are disposed above and at two sides of the semiconductor channel region 42, and form the TFT 24 together with the gate 36, the gate insulating layer 38, and the semiconductor channel region 42. The top electrode line 28 is disposed at a side of the TFT 24, and the second contact pad 32 is positioned in the periphery area 16. A patterned dielectric layer 56 is further disposed on the substrate 12 and covers the TFT 24, the first contact pad 30, the second contact pad 32, and the top electrode line 28. The patterned dielectric layer 56 has a first via hole 58 that exposes a portion of the drain 52, a second via hole 60 that exposes the top electrode line 28, a third via hole 62 that exposes the first contact pad 30, and at least a fourth via hole 64 that exposes the second contact pad 32 or the third contact pad 33. In addition, the X-ray detector 10 comprises a patterned third conductive layer 66 disposed on the surface of the patterned dielectric layer 56, wherein portions of the patterned third conductive layer 66 are filled in the first via hole 58, the second via hole 60, the third via hole 62, and the fourth via hole 64. The patterned third conductive layer 66 includes a plurality of bottom sensing electrodes 68 in each sensing pixel 18 respectively. Each bottom sensing electrode 68 is electrically connected to the corresponding drain 52 through the first via hole 58. In addition, the portion of the patterned third conductive layer 66 filled in the second via hole 60 may serve as a contact device 70 for electrically connecting the top electrode line 28 and a top sensing electrode 84. However, in other embodiments, the X-ray detector 10 may not include the top electrode line 28 shown in FIG. 2 while the portion of the patterned third conductive layer 66 electrically connected to the top sensing electrode 84 directly serves as a top electrode line itself. In addition, the patterned third conductive layer 66 disposed in the third via hole 62 serves as a first contact plug 72 for electrically connecting an external circuit and the first contact pad 30, and the patterned third conductive layer 66 disposed in the fourth via hole 64 serves as a second contact plug 74 which is electrically connected to the second contact pad 32 or the third contact pad 33.

Furthermore, the X-ray detector 10 comprises a patterned Si-rich dielectric layer 78 disposed on the surface of the bottom sensing electrode 68 for serving as photo-sensing material. The patterned Si-rich dielectric layer 78 comprises a plurality of sensor units 76 disposed in each sensing pixel 18 respectively. The material of the patterned Si-rich dielectric layer 78 can be such as Si-rich silicon oxide (SiOx), Si-rich silicon nitride (SiNy), Si-rich silicon oxynitride (SiOxNy), Si-rich silicon carbide (SiCz), Si-rich silicon oxycarbide (SiOxCz), hydrogenated Si-rich silicon oxide (SiHwOx), hydrogenated Si-rich silicon nitride (SiHwNy), hydrogenated Si-rich silicon oxynitride (SiHwOxNy) or a combination of the aforementioned materials, wherein $0<w<4$, $0<x<2$, $0<y<1.67$, $0<z<1$, or may comprise combinations of silicon, oxygen, nitrogen, carbon, hydrogen and other materials. A patterned transparent conductive layer 82 is further disposed on the surface of the patterned Si-rich dielectric layer 78, comprising a plurality of top sensing electrodes 84 disposed in each sensing pixel 18 respectively. Each top sensing electrode 84 is electrically connected to the corresponding top electrode line 28 through the contact device 70. As a result, the photo-sensing device 26 of each sensing pixel 18 is composed of the bottom sensing electrode 68, the sensor unit 76, and the top sensing electrode 84. The X-ray detector 10 further comprises a passivation layer 90 and a scintillator layer 92, wherein the passivation layer 90 covers the patterned transparent conductive layer 82 and a portion of the patterned third conductive layer 66. In this embodiment, the passivation layer 90 includes an inorganic passivation layer 86 with a small thickness and a thicker organic planarization layer 88 disposed above the inorganic passivation layer 86. The scintillator layer 92 is disposed on the surface of the organic planarization layer 88, corresponding to the patterned Si-rich dielectric layer 78. The scintillator layer 92 preferably covers the whole photo-sensing area 14 shown in FIG. 1. The scintillator layer 92 may be made of cesium iodide (CsI) or related compounds or materials for transforming the X-ray into a visible light. As shown in FIG. 2, when X-ray illuminates the X-ray detector 10 from the top side, the scintillator layer 92 transforms X-ray into visible light (with a wavelength of about 450-650 nanometers) downward. Under the illumination of visible light, the sensor unit 76 will produce photocurrent, which will be output as a readout signal (or called sensing signal) through the readout lines 22 in cooperation with the bottom sensing electrodes 68, the TFTs 24, and the scan lines 20, such that a detected X-ray image can be obtained.

Figure 3:
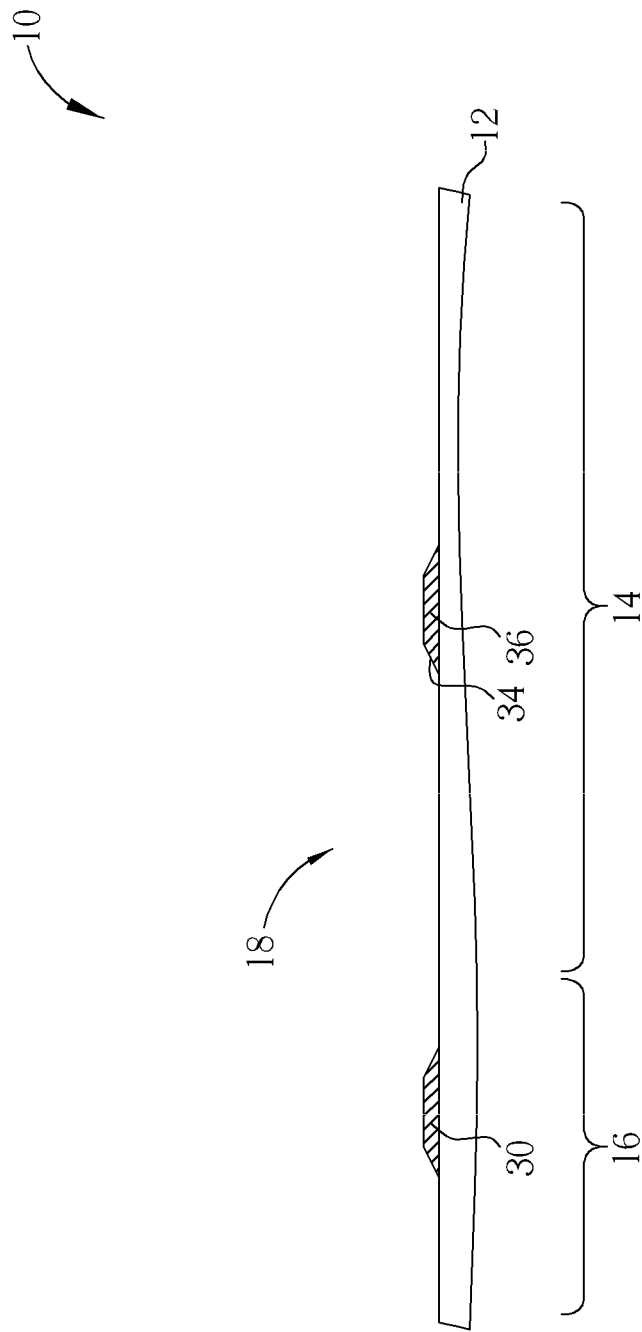
FIGS. 3-8 are schematic diagrams showing the fabrication method and sectional-views of the X-ray detector according to a first embodiment of the present invention.

The fabrication method of the present invention X-ray detector 10 is shown in FIGS. 3-8. First, the substrate 12 is provided as shown in FIG. 3. The substrate 12 comprises the periphery area 16 and the photo-sensing area 14, wherein the photo-sensing area 14 includes a plurality of sensing pixels 18 arranged as an array in the photo-sensing area 14. Then, the patterned first conductive layer 34 is formed on the surface of the substrate 12, which comprises the gate 34 positioned in each sensing pixel 18 and at least a first contact pad 30 positioned in the periphery area 16.

Figure 4:
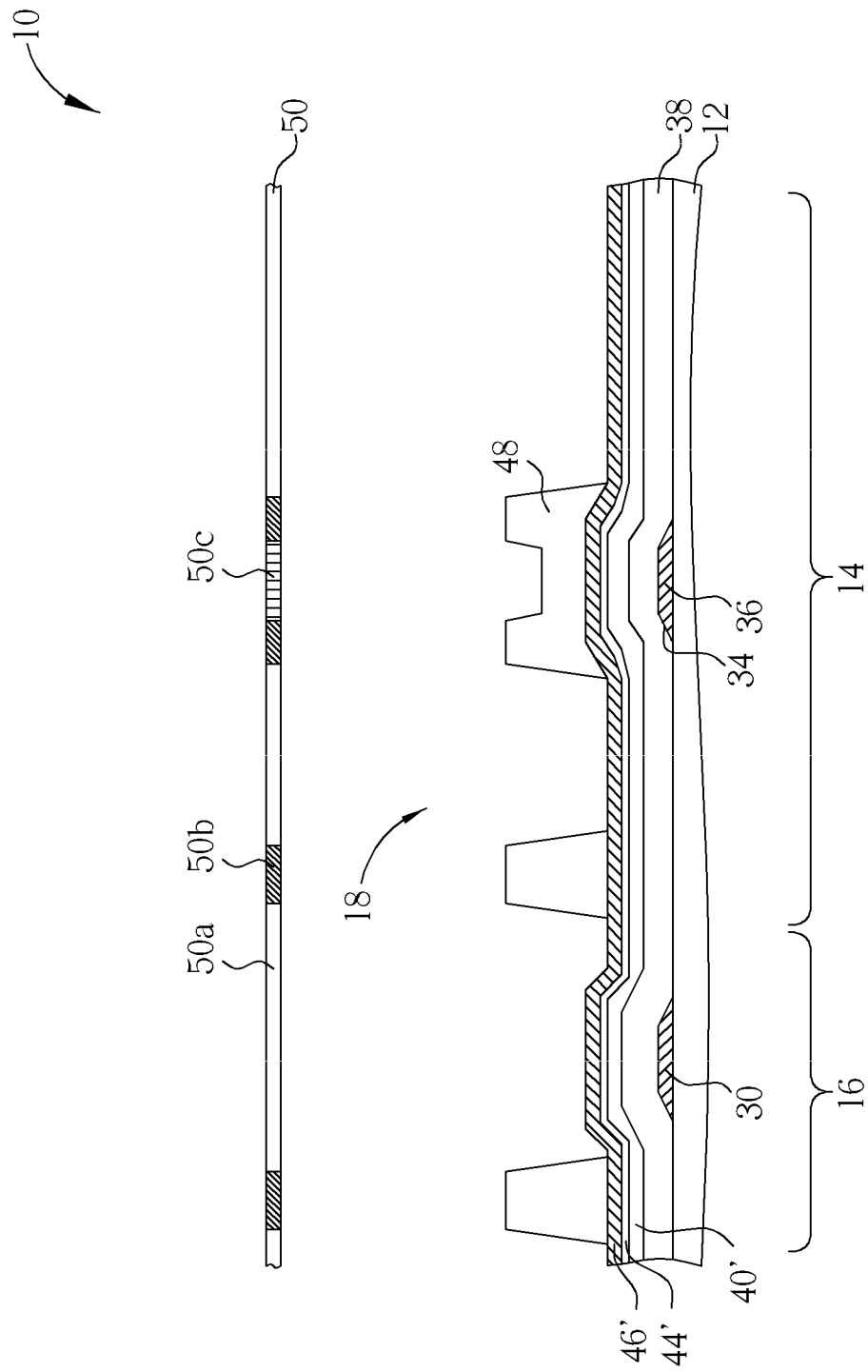

Referring to FIG. 4, a gate insulating layer 38, a semiconductor layer 40', a doped semiconductor layer 44' (such as a doped amorphous silicon layer), and a second conductive layer 46' are successively formed on the substrate 12. After that, a photoresist layer 48 is formed on the second conductive layer 46', and a half-tone photomask 50 is utilized to perform a photolithography-etching process to the thin film layers on the substrate 12. The half-tone photomask 50 includes a transparent region 50a, an opaque region 50b, and a half-tone region 50c. The opaque region 50b corresponds to the patterns of the patterned second conductive layer 46 shown in FIG. 2, such as the second contact pad 32, the third contact pad 33, the top electrode line 28, the drain 52, and the source 54. The transparent region 50a corresponds to a portion of the second conductive layer 46' predetermined to be removed. The half-tone region 50c corresponds to the portion of the semiconductor channel region 42 positioned between the drain 52 and the source 54. After the photolithography and development processes, the remaining photoresist layer 48 is shown in FIG. 4.

Figure 5:
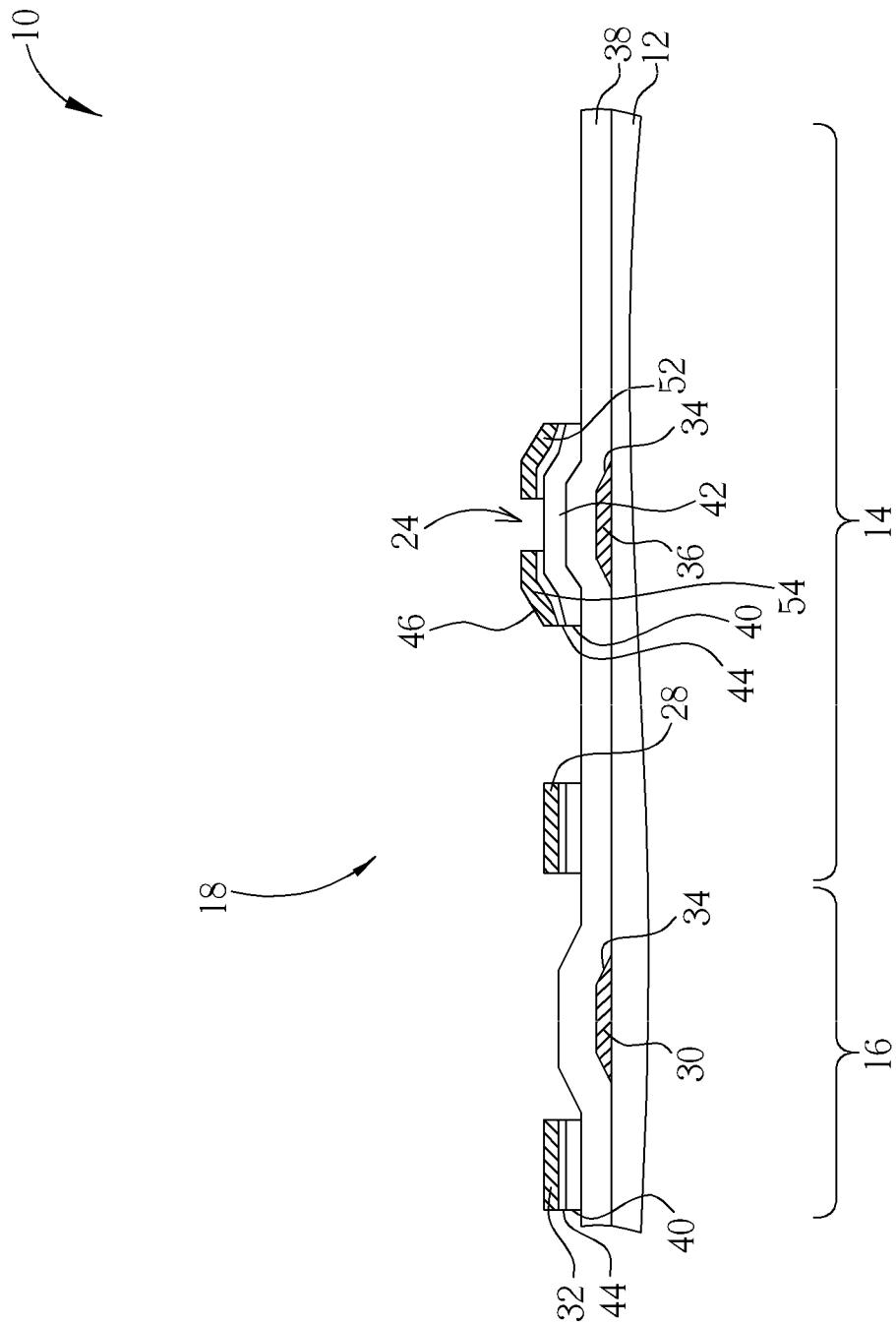

Sequentially, the patterned photoresist layer 48 is used as an etching mask to perform the etching process for removing portions of the second conductive layer 46', the doped semiconductor layer 44', and the semiconductor layer 40' until the surface of the gate insulating layer 38 is exposed, so as to form the patterned second conductive layer 46, the patterned doped semiconductor layer 44, and the patterned semiconductor layer 40, as shown in FIG. 5. The patterned second conductive layer 46 comprises the drain 52 and the source 54 disposed at two sides of the gate 34 and above the gate 34. The portion of the patterned semiconductor layer 40 positioned between the gate 34, the drain 52, and the source 54 serves as the semiconductor channel region 42. In addition, the doped semiconductor layer 44 disposed below the drain 52 and source 54 serves as an ohmic contact layer.

Figure 6:
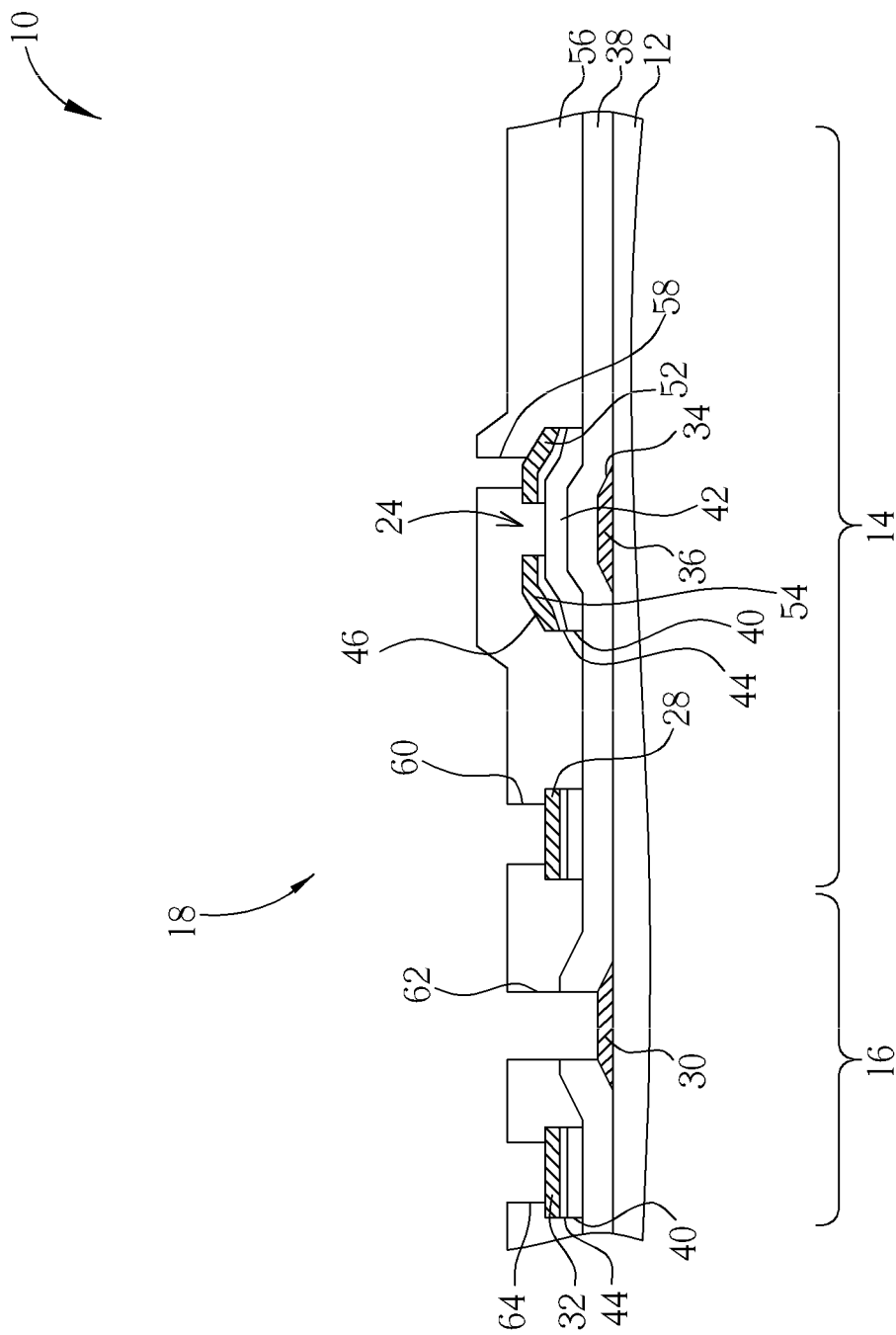
Figure 7:
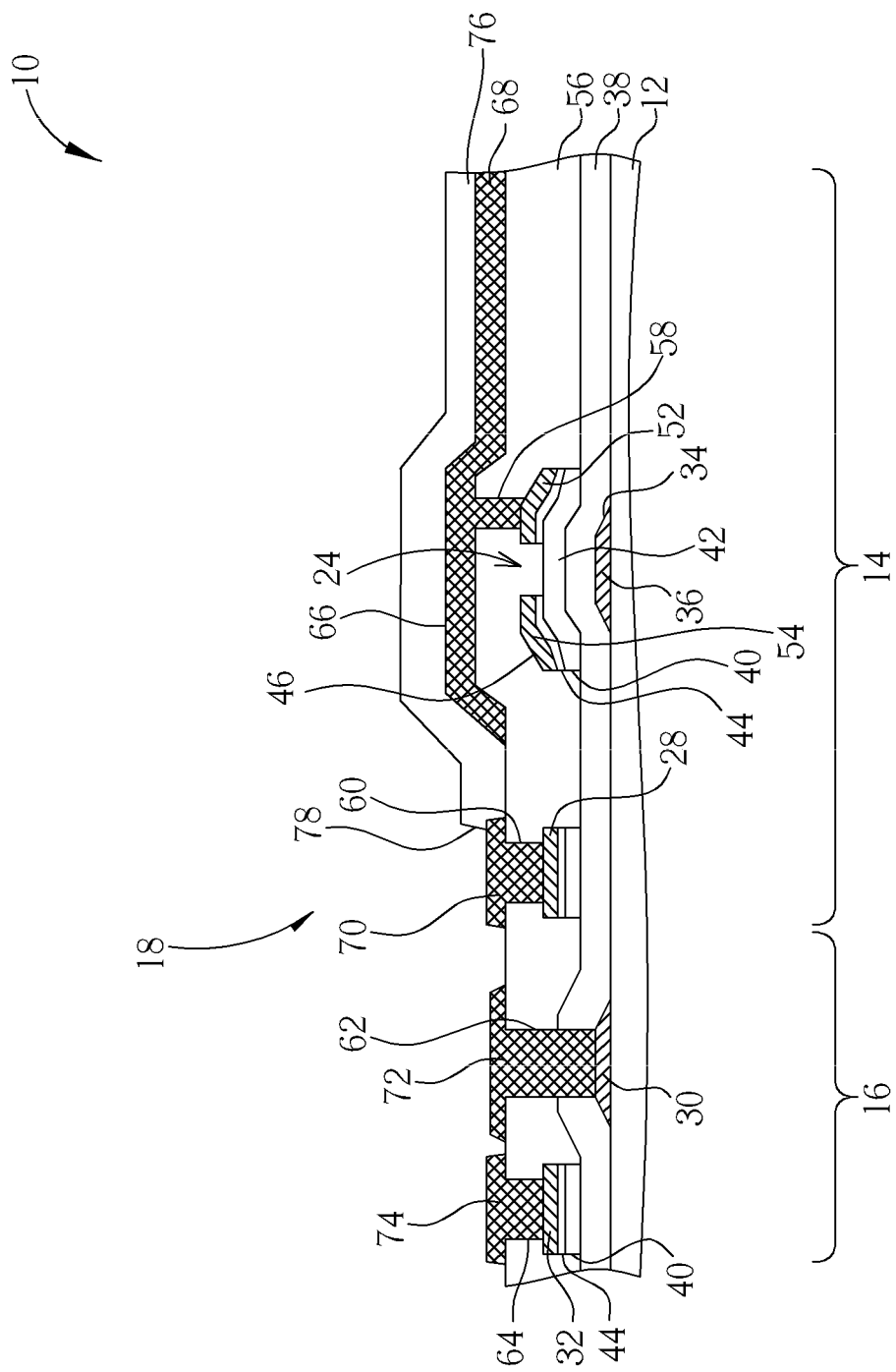

With reference to FIG. 6, a patterned dielectric layer 56 is then formed on the substrate 12. The patterned dielectric layer 56 comprises the first via hole 58, the second via hole 60, the third via hole 62 and the fourth via hole 64 exposing portions of the drain 52, the top electrode line 28, the first contact pad 30, and the second contact pad 32 or and the third contact pad 33 respectively. Referring to FIG. 7, a patterned third conductive layer 66 is formed on the substrate 12. The patterned third conductive layer 66 comprises a plurality of bottom sensing electrodes 68 positioned in each sensing pixel 18 respectively, at least one contact device 70 disposed in the second via hole 60, at least one first contact plug 72 disposed in the third via hole 62, and at least one second contact plug 74 disposed in the fourth via hole. Wherein, the bottom sensing electrode 68, the contact device 70, the first contact plug 72, and the second contact plug 74 are electrically connected to the drain 52, the top electrode line 28, the first contact pad 30, and the second contact pad 32 or the third contact pad 33 respectively.

Following that, the patterned Si-rich dielectric layer 78 is formed on the substrate 12. The patterned Si-rich dielectric layer 78 is disposed on the surface of the bottom sensing electrode 68 for serving as a photo-sensing material of the X-ray detector 10, which comprises a plurality of sensor units 76 positioned in each sensing pixel 18 respectively. The patterned Si-rich dielectric layer 78 may be, such as Si-rich SiOx, Si-rich SiNy, Si-rich SiOxNy, Si-rich SiCz, Si-rich SiOxCz, hydrogenated Si-rich SiHwOx, hydrogenated Si-rich SiHwNy, hydrogenated Si-rich SiHwOxNy, or the combinations of the above materials and other materials.

Figure 8:
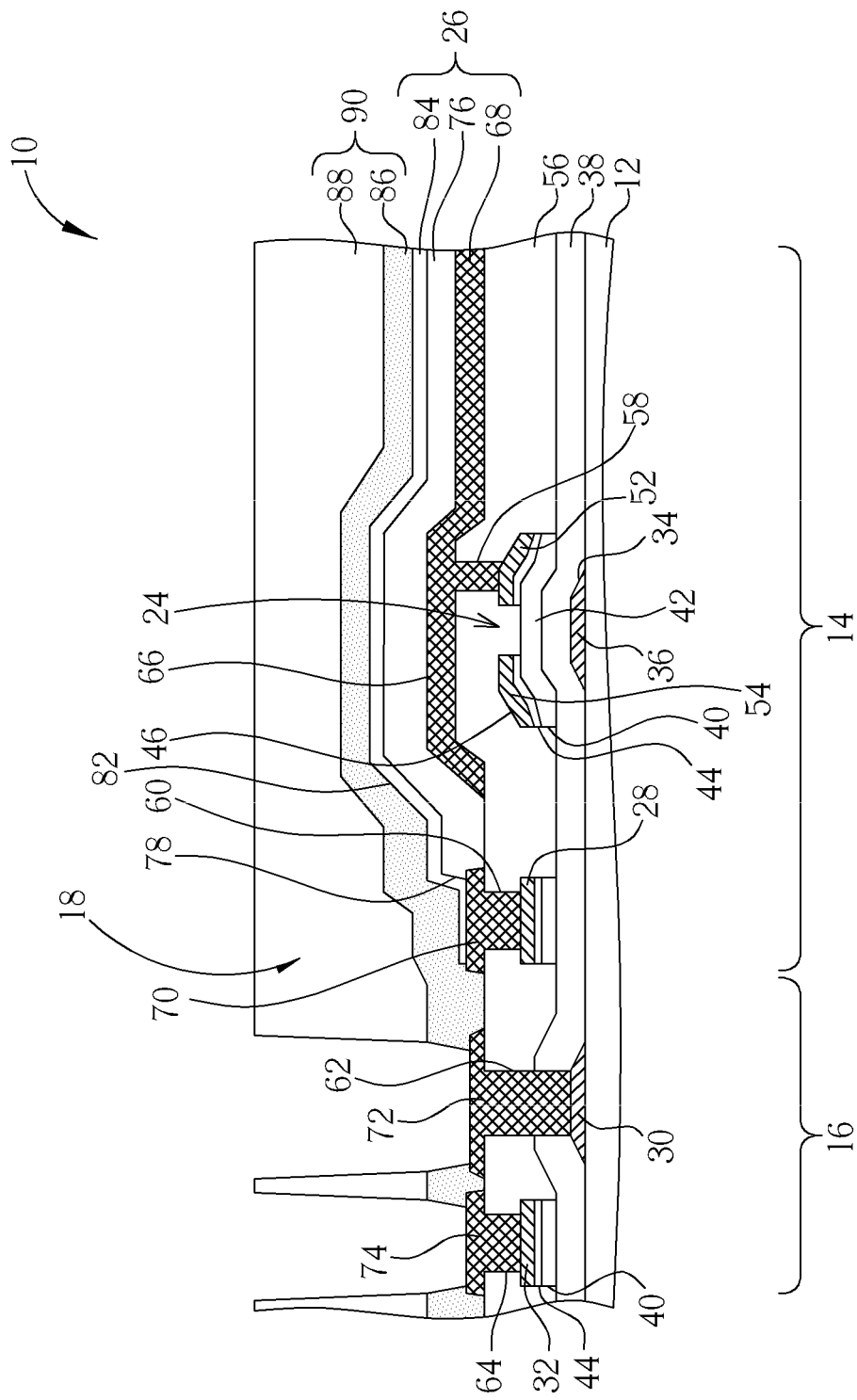

Then, as shown in FIG. 8, a patterned transparent conductive layer 82 is formed on the surface of the patterned Si-rich dielectric layer 78. The patterned transparent conductive layer 82 comprises a plurality of top sensing electrodes 84 respectively disposed in each sensing pixel 18 and electrically connected to the corresponding top electrode line 28 through the contact device 70. Therefore, the photo-sensing device 26 in each sensing pixel 18 is composed of the bottom sensing electrode 68, the sensor unit 76, and the top sensing electrode 84.

Sequentially, a passivation layer 90 is formed on the substrate 12, which comprises an inorganic passivation layer 86 and an organic planarization layer 88 covering the photo-sensing area 14 but exposing the first contact plug 72 and the second contact plug 74. Referring to FIG. 2, a scintillator layer 92 is then formed on the organic planarization layer 86 to cover the photo-sensing area 14. The formation step of the scintillator layer 92 may include a coating process or an evaporation process. In other embodiment, the scintillator layer 92 may be formed through an attaching process. After the formation of the scintillator layer 92, the fabrication of the X-ray detector 10 according to the first embodiment of the present invention is completed. As a result, the whole fabrication process of the X-ray detector 10 only needs seven photolithography-etching processes.

Figure 9:
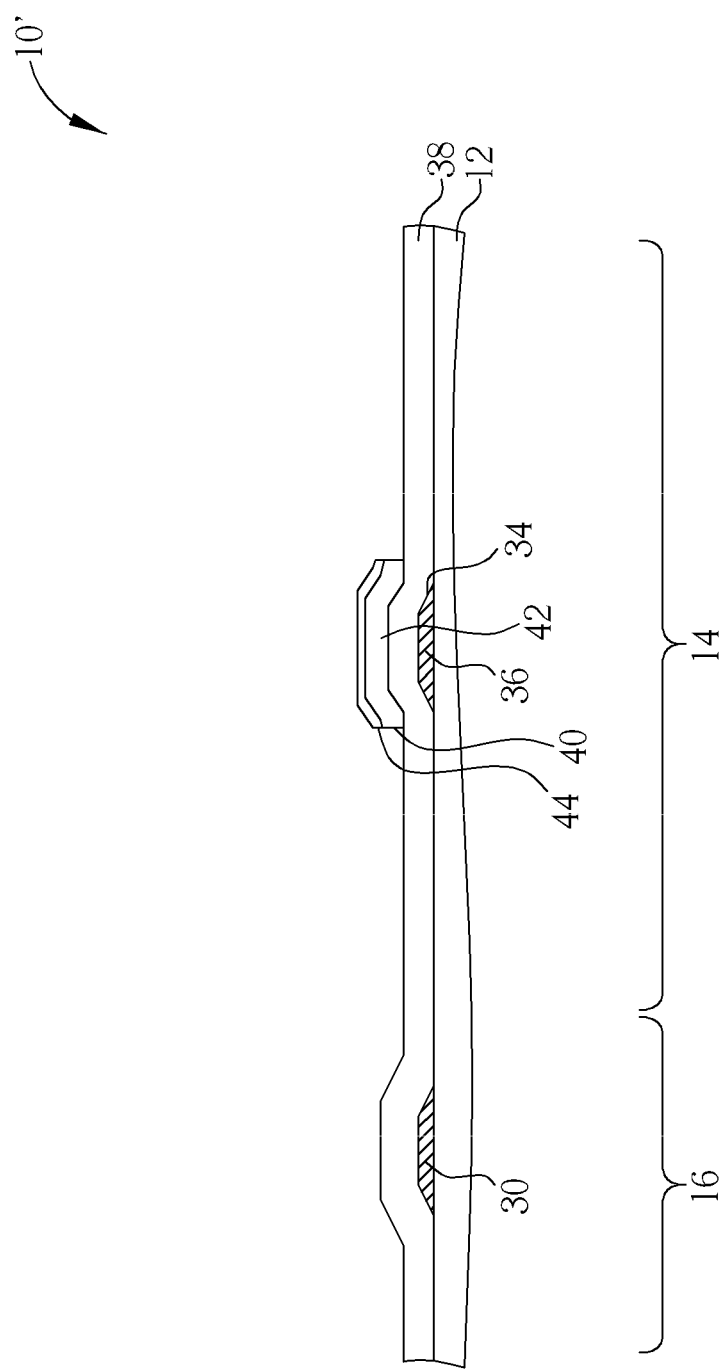
FIGS. 9-12 are schematic diagrams showing the fabrication method of the X-ray detector according to a second embodiment of the present invention.

With reference to FIG. 9 to FIG. 12, the fabrication process of the X-ray detector according to a second embodiment of the present invention is shown in FIG. 9 to FIG. 12. The difference between this embodiment and the first embodiment includes that no half-tone photomask is used during the fabrication process. Therefore, one more photolithography-etching process is needed in this embodiment. Furthermore, the scintillator layer 92 of this embodiment is formed on another substrate. Referring to FIG. 9, the similar devices of the X-ray detector 10' of the second embodiment is represented with the same numerals shown in the first embodiment. First, the patterned first conductive layer 34 and the gate insulating layer 38 are formed on the substrate 12 through formation processes similar to the previous embodiment. Then, a semiconductor layer and a doped semiconductor layer (not shown) are successively blanketly deposited on the substrate 12, and a photolithography-etching process is performed to remove portions of the semiconductor layer and the doped semiconductor layer at the same time so as to form the patterned semiconductor layer 40 and the patterned doped semiconductor layer 44.

Figure 10:
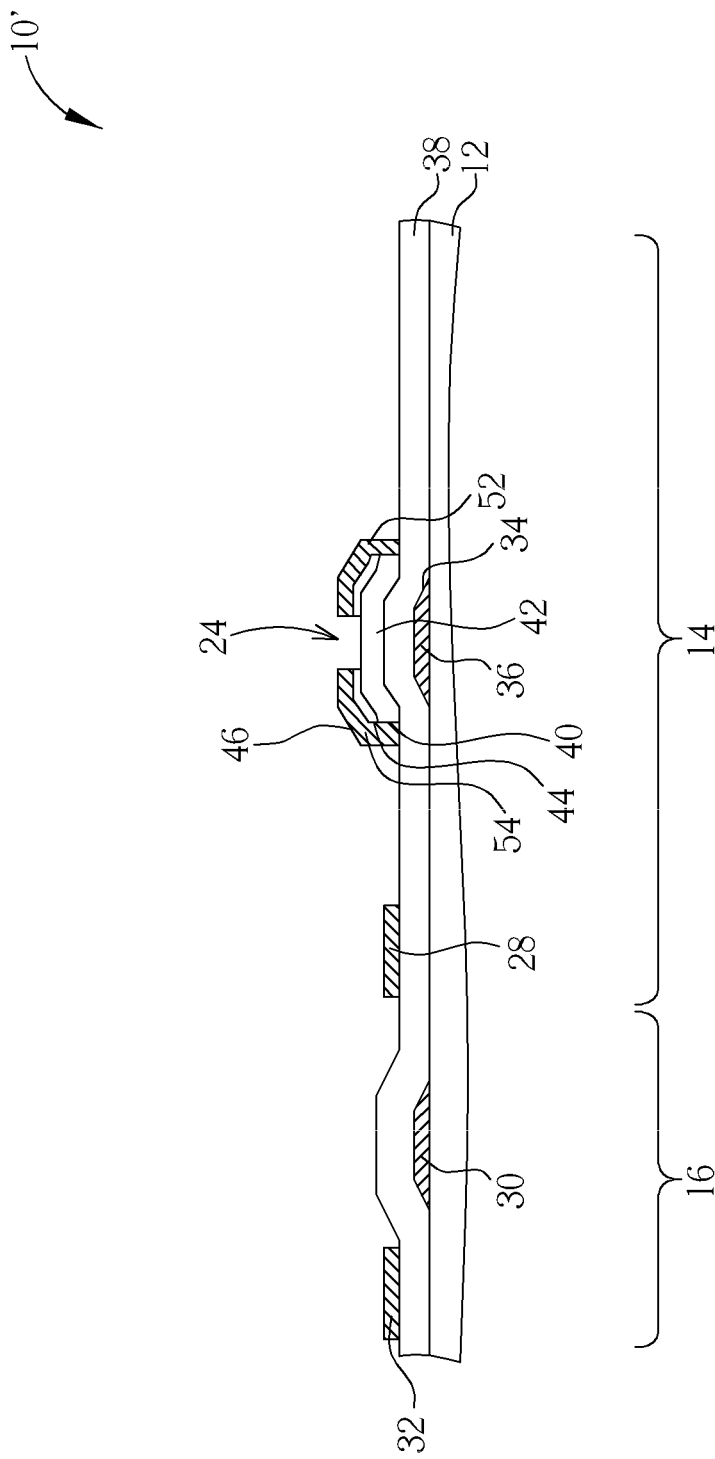

Sequentially, as shown in FIG. 10, a second conductive layer (not shown) is deposited on the substrate 12. After a further photolithography-etching process is performed, a portion of the second conductive layer and a portion of the doped semiconductor layer 44 are removed so as to form the patterned second conductive layer 46 that comprises the drain 52 and the source 54 at two sides of the semiconductor channel region 42 and above the gate 36, the top electrode line 28 at a side of the gate 36, and the second contact pad 32 (and the third contact pad 33 as shown in FIG. 1) positioned in the periphery area 16.

Figure 11:
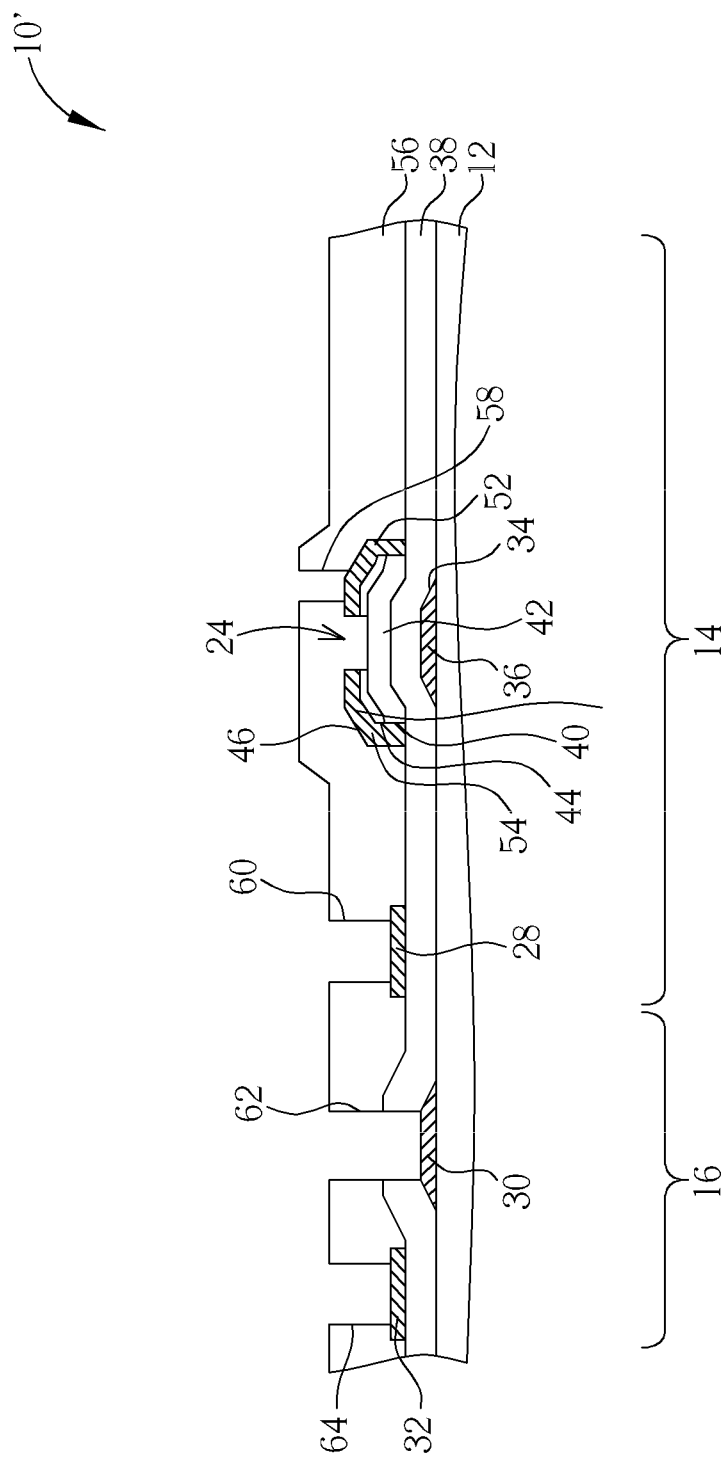
Figure 12:
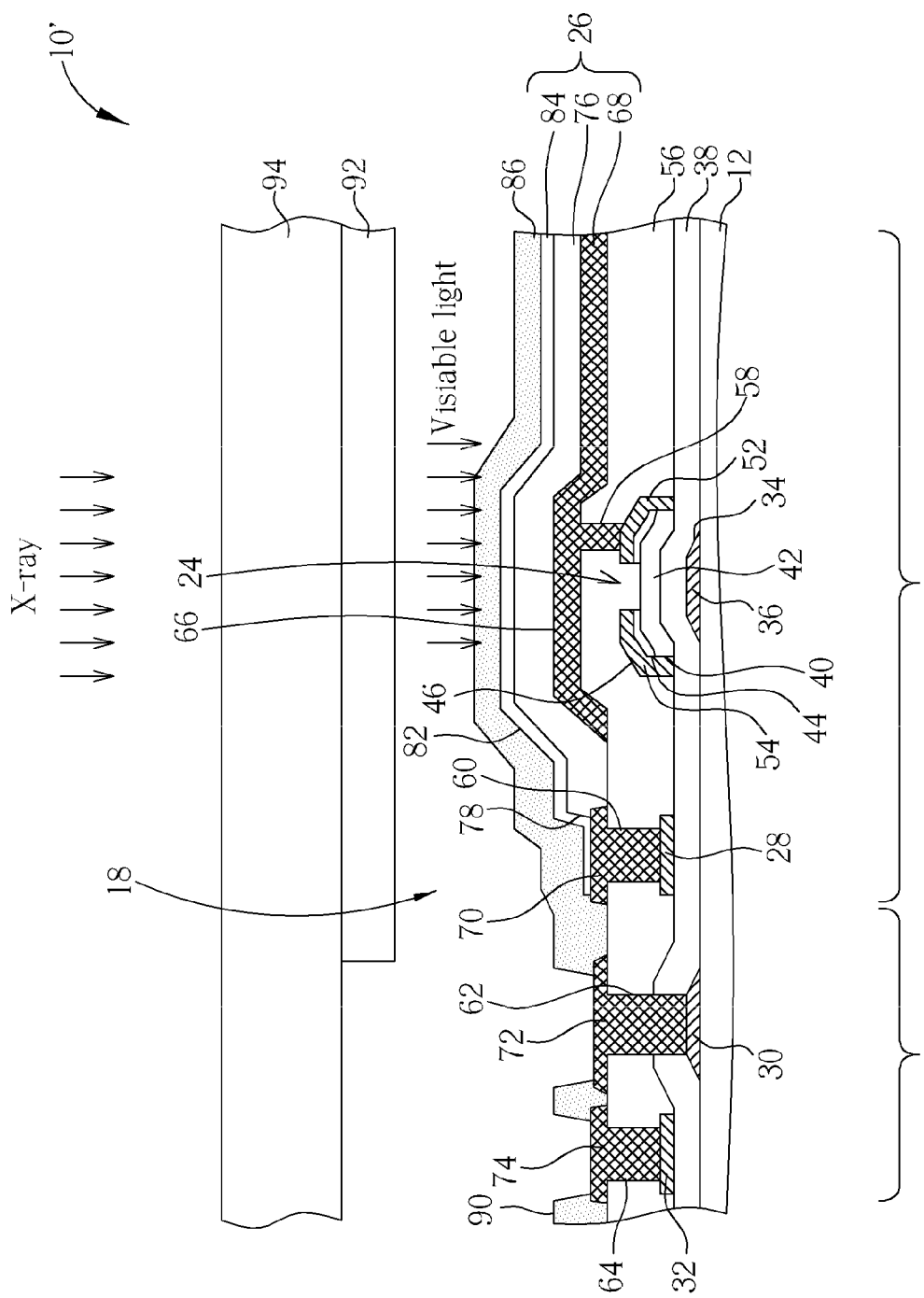

Referring to FIG. 11, a patterned dielectric layer 56 is then formed on the substrate 12, wherein the patterned dielectric layer 56 comprises a first via hole 58, a second via hole 60, a third via hole 62, and a fourth via hole 64 that respectively expose portions of the drain 52, the top electrode line 28, the first contact pad 30, and the second contact pad 32 or the third contact pad 33. As shown in FIG. 12, similar to the formation process of the first embodiment, a patterned third conductive layer 66, a patterned Si-rich dielectric layer 78, and a patterned transparent conductive layer 82 are successively formed on the substrate 12 so as to form electric devices such as the bottom sensing electrode 68, the sensor unit 76, and the top sensing electrode 84. Then, a passivation layer 86 is formed to cover the devices on the substrate 12, which exposes portions of the first and second contact pads 30, 32. In addition, the fabrication method of the present invention X-ray detector 10' further comprises providing a substrate 94 and forming a scintillator layer 92 on the surface of the substrate 94, wherein the formation method of the scintillator layer 92 may include a coating process, an evaporation process, or an attaching process. For example, a thin film comprises CsI material may be attached onto the surface of the substrate 94. Finally, the substrate 94 and the substrate 12 are assembled to make the scintillator layer 92 correspond to the photo-sensing area 14 or the patterned Si-rich dielectric layer 78. Therefore, when X-ray illuminates the scintillator layer 92 on the substrate 94 from the top side, the scintillator layer 92 will transform X-ray into visible light such that the photo-sensing device 26 positioned below the scintillator layer 92 can detect the visible light. In this embodiment, only eight photolithography-etching processes are needed for completing the fabrication process of the X-ray detector 10'.

Figure 13:
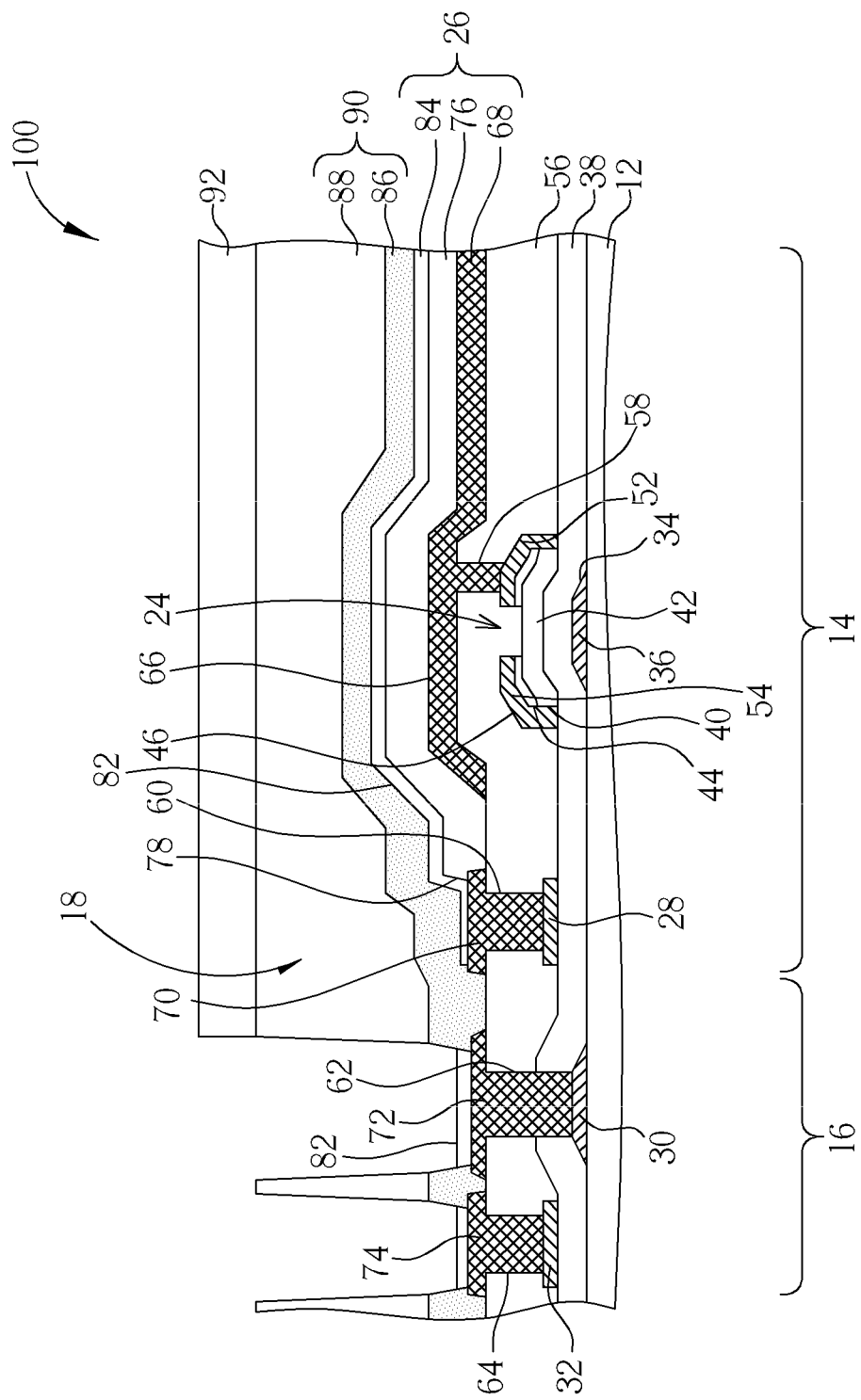
FIG. 13 is a schematic sectional view of an X-ray detector according to a third embodiment of the present invention.

With reference to FIG. 13, FIG. 13 is a schematic diagram of an X-ray detector 100 according to a third embodiment of the present invention. In this embodiment, the TFT of the X-ray detector 100 is formed through three photolithography-etching processes, and the scintillator layer 92 is directly formed on the surface of the passivation layer 90. It should be noted that the patterned transparent conductive layer 82 further covers the surfaces of the first and the second contact plugs 72, 74. The patterned transparent conductive layer 82 preferably comprises indium tin oxide (ITO) materials. Since ITO has high stability, the patterned transparent conductive layer 82 may provide a function to protect the first and second contact plugs 72, 74.

In addition, in other embodiments, the patterned second conductive layer 46 may do not include the top electrode line 28 shown in FIG. 13. In contrary, a portion of the patterned third conductive layer 66 is utilized to serve as the top electrode line and to substitute the top electrode line 28 composed of the patterned second conductive layer 46 of the third embodiment. Furthermore, in various embodiments of the present invention, the disposition of the contact device 70 can be omitted, while a portion of top sensing electrode 84 of the patterned transparent conductive layer 82 is filled into the second via hole 60 and is electrically connected to the top electrode line 28 directly. Alternatively, a portion of the patterned transparent conductive layer 82 may be used as the top electrode line, thus it is not needed to form the top electrode line 28 formed by the patterned second conductive layer 46 and the contact device 70 formed by the patterned third conductive layer 66.

As a result, the X-ray detector of the present invention is a kind of X-ray flat indirect detector system, wherein the scintillator layer is used for transforming X-ray into visible light and Si-rich dielectric layer is used as the photo-sensing material of the photo-sensing device. In contrast to the prior art, it only needs seven to eight photolithography-etching processes for fabricating the essential thin-film devices of the present invention X-ray detector. Therefore, the number of photomasks used in the whole fabrication process and manufacture cost can be effectively reduced. In addition, the thickness of the Si-rich dielectric layer can be smaller than about 0.5 μm, such that the X-ray detector of the present invention has advantages of low cost and high yield. Furthermore, besides medical X-ray photography system, the present invention X-ray detector may be applied to electron microscopy or other photo-sensing devices with X-ray image scanning system or X-ray photography system.

Those skilled in the art will readily observe that numerous modifications and alterations of the device and method may be made while retaining the teachings of the invention.

What is claimed is:

1. An X-ray detector, comprising:
   a substrate, comprising a photo-sensing area;
   a patterned first conductive layer disposed on the substrate, the patterned first conductive layer comprising at least a gate positioned in the photo-sensing area;
   a gate insulating layer disposed on the substrate and covering the gate;
   a patterned semiconductor layer disposed on a surface of the gate insulating layer above the gate, the patterned semiconductor layer comprising a semiconductor channel region;
   a patterned second conductive layer, comprising at least a source and a drain disposed on the patterned semiconductor layer and positioned at two sides of the semiconductor channel region respectively;
   a dielectric layer disposed on the substrate and covering the semiconductor channel region and a portion of the patterned second conductive layer, the dielectric layer comprising a first via hole that exposes a portion of the drain;

a patterned third conductive layer, comprising a bottom sensing electrode positioned in the photo-sensing area and disposed above the patterned semiconductor layer, the bottom sensing electrode being electrically connected to the drain through the first via hole;

a patterned photosensitive silicon-rich (Si-rich) dielectric layer, disposed on a surface of the bottom sensing electrode;

a patterned transparent conductive layer, comprising a top sensing electrode disposed on a surface of the patterned photosensitive Si-rich dielectric layer;

a passivation layer, covering at least a portion of the patterned transparent conductive layer; and a scintillator layer, disposed above the passivation layer and corresponding to the patterned photosensitive Si-rich dielectric layer.

2. The X-ray detector of claim 1, further comprising a top electrode line disposed on the substrate and electrically connected to the patterned transparent conductive layer.

3. The X-ray detector of claim 2, wherein the dielectric layer comprises a second via hole that exposes a portion of the top electrode line.

4. The X-ray detector of claim 3, wherein the patterned third conductive layer further comprises a portion disposed in the second via hole for electrically connecting the top electrode line and the top sensing electrode.

5. The X-ray detector of claim 2, wherein the top electrode line is a portion of the patterned second conductive layer.

6. The X-ray detector of claim 1, wherein the substrate further comprises a periphery area disposed at a side of the photo-sensing area, and the patterned first conductive layer comprises a first contact pad positioned in the periphery area.

7. The X-ray detector of claim 6, wherein the patterned second conductive layer further comprises a second contact pad and a third contact pad positioned in the periphery area.

8. The X-ray detector of claim 7, wherein the patterned dielectric layer exposes portions of the first contact pad and the second contact pad, and the patterned third conductive layer further comprises a first contact plug and a second contact plug electrically connected to the first contact pad and the second contact pad respectively.

9. The X-ray detector of claim 8, wherein the passivation layer exposes portions of the first and second contact plugs.

10. The X-ray detector of claim 8, wherein the patterned transparent conductive layer comprises a portion covering the first and the second contact plugs.

11. The X-ray detector of claim 1, wherein the passivation layer comprises an inorganic passivation layer and an organic planarization layer disposed on a surface of the patterned transparent conductive layer in order.

12. The X-ray detector of claim 1, wherein a material of the scintillator layer comprises cesium iodide.

13. The X-ray detector of claim 1, wherein the scintillator layer is capable of transforming X-ray into visible light that is sensed by the photosensitive Si-rich dielectric layer to enable the X-ray detector to detecting the X-ray.

14. The X-ray detector of claim 1, wherein a patterned doped semiconductor layer is disposed between the patterned semiconductor layer and the patterned second conductive layer.

15. A fabrication method of X-ray detector, comprising:
providing a substrate, the substrate comprising a photo-sensing area;
forming a thin film transistor (TFT) on the substrate, the TFT comprising a gate, a gate insulating layer, a patterned semiconductor layer, a source, and a drain;

forming a patterned dielectric layer on the substrate, the patterned dielectric layer having at least a first via hole that exposes a portion of the drain;

forming a patterned third conductive layer on the substrate, the patterned third conductive layer comprising a bottom sensing electrode positioned in the photo-sensing area and being electrically connected to the drain through the first via hole, and the patterned third conductive layer being positioned above the patterned semiconductor layer;

forming a patterned photosensitive Si-rich dielectric layer on the substrate, the patterned photosensitive Si-rich dielectric layer being disposed on a surface of the bottom sensing electrode;

forming a patterned transparent conductive layer on the substrate, the patterned transparent conductive layer comprising at least a top sensing electrode covering the patterned photosensitive Si-rich dielectric layer;

forming a passivation layer on the substrate to cover the patterned transparent conductive layer; and forming a scintillator layer on the substrate, the scintillator layer being disposed on the passivation layer and corresponding to the patterned Si-rich dielectric layer.

16. The fabrication method of claim 15, wherein the step of forming the thin film transistor (TFT) on the substrate comprises:
forming a patterned first conductive layer on the substrate, the patterned first conductive layer comprising at least a gate positioned in the photo-sensing area;
forming a gate insulating layer on the substrate to cover a surface of the gate; and
forming a patterned semiconductor layer and a patterned second conductive layer on a surface of the gate insulating layer, the patterned semiconductor layer comprising a semiconductor channel region positioned on a portion of the gate insulating layer above the gate, the patterned second conductive layer comprising a source and a drain disposed on the patterned semiconductor layer and at two sides of the semiconductor channel region respectively.

17. The fabrication method of claim 15, wherein the patterned second conductive layer further comprises a top electrode line electrically connected to the top sensing electrode.

18. The fabrication method of claim 17, wherein the patterned dielectric layer further comprises at least a second via hole that exposes a portion of the top electrode line, and the patterned third conductive layer comprises a portion disposed in the second via hole for electrically connecting the top sensing electrode and the top electrode line.

19. The fabrication method of claim 15, wherein the substrate further comprises a periphery area disposed at a side of the photo-sensing area, and the patterned first conductive layer comprises a first contact pad positioned in the periphery area.

20. The fabrication method of claim 19, wherein the patterned second conductive layer comprises a second contact pad and a third contact pad positioned in the periphery area.

21. The fabrication method of claim 20, wherein the patterned dielectric layer exposes portions of the first contact pad and the second contact pad, and the patterned third conductive layer comprises a first contact plug and a second contact plug electrically connected to the first contact pad and the second contact pad respectively.

22. The fabrication method of claim 21, wherein the passivation layer exposes portions of the first contact plug and the second contact plug.

23. The fabrication method of claim 21, wherein the patterned transparent conductive layer covers the first and the second contact plugs.

24. The fabrication method of claim 15, wherein the step of forming the patterned semiconductor layer and the patterned second conductive layer comprises:
successively forming an amorphous silicon layer and a second conductive layer on the gate insulating layer;
forming a photoresist layer on the second conductive layer; and
removing a portion of the amorphous silicon layer and a portion of the second conductive layer at the same time to form the patterned semiconductor layer and the patterned second conductive layer by performing a photolithography-etching process (PEP) with a half-tone photomask.

25. The fabrication method of claim 24, wherein the half-tone photomask comprises:
at least a half-tone region corresponding to a portion of the semiconductor channel region; and
at least an opaque region corresponding to the source and the drain.

26. The fabrication method of claim 15, wherein the step of forming the patterned semiconductor layer and the patterned second conductive layer comprises:
forming an amorphous silicon layer on the gate insulating layer;
removing a portion of the amorphous silicon layer to leave a portion of the amorphous silicon layer positioned above the gate to form the semiconductor channel region by performing a first photolithography-etching process;
forming a second conductive layer on the substrate; and
removing a portion of the second conductive layer to leave at least portions of the second conductive layer positioned above and at two sides of the gate so as to form the source and the drain by performing a second photolithography-etching process.

27. The fabrication method of claim 15, wherein the passivation layer comprises an inorganic passivation layer and an organic planarization layer disposed on a surface of the patterned transparent conductive layer in order.

28. The fabrication method of claim 15, wherein a material of the scintillator layer comprises cesium iodide (CsI).

29. The fabrication method of claim 15, wherein a process for the step of forming the scintillator layer comprises a coating process, an evaporation process, or an attaching process.

30. The fabrication method of claim 15, further comprising forming a patterned doped semiconductor layer between the patterned semiconductor layer and the patterned second conductive layer.

31. An X-ray detector, comprising:
a substrate, comprising a photo-sensing area;
a thin film transistor (TFT) positioned in the photo-sensing area on the substrate, the TFT comprising a gate, a gate insulating layer, a patterned semiconductor layer with a semiconductor channel region, a source, and a drain;
a dielectric layer disposed on the substrate and covering the semiconductor channel region, the source, and a portion of the drain, the dielectric layer comprising a first via hole that exposes a portion of the drain;
a patterned third conductive layer, comprising a bottom sensing electrode positioned in the photo-sensing area and disposed above the patterned semiconductor layer, the bottom sensing electrode being electrically connected to the drain through the first via hole;
a patterned photosensitive silicon-rich (Si-rich) dielectric layer, disposed on a surface of the bottom sensing electrode;
a patterned transparent conductive layer, comprising a top sensing electrode disposed on a surface of the patterned photosensitive Si-rich dielectric layer;
a passivation layer, covering at least a portion of the patterned transparent conductive layer; and
a scintillator layer, disposed above the passivation layer and corresponding to the patterned photosensitive Si-rich dielectric layer.

32. An X-ray detector, comprising:
a substrate, comprising a photo-sensing area and a periphery area disposed at a side of the photo-sensing area;
a patterned first conductive layer disposed on the substrate, the patterned first conductive layer comprising at least a gate positioned in the photo-sensing area and a first contact pad positioned in the periphery area;
a gate insulating layer disposed on the substrate and covering the gate;
a patterned semiconductor layer disposed on a surface of the gate insulating layer above the gate, the patterned semiconductor layer comprising a semiconductor channel region;
a patterned second conductive layer, comprising at least a source and a drain disposed on the patterned semiconductor layer and positioned at two sides of the semiconductor channel region respectively, and a second contact pad and a third contact pad positioned in the periphery area;
a dielectric layer disposed on the substrate and covering the semiconductor channel region and a portion of the patterned second conductive layer, the dielectric layer comprising a first via hole that exposes a portion of the drain, wherein the dielectric layer exposes portions of the first contact pad and the second contact pad;
a patterned third conductive layer, comprising a bottom sensing electrode positioned in the photo-sensing area and disposed above the patterned semiconductor layer, the bottom sensing electrode being electrically connected to the drain through the first via hole, wherein the patterned third conductive layer further comprises a first contact plug and a second contact plug electrically connected to the first contact pad and the second contact pad respectively;
a patterned photosensitive silicon-rich (Si-rich) dielectric layer, disposed on a surface of the bottom sensing electrode;
a patterned transparent conductive layer, comprising a top sensing electrode disposed on a surface of the patterned photosensitive Si-rich dielectric layer;
a passivation layer, covering at least a portion of the patterned transparent conductive layer; and
a scintillator layer, disposed above the passivation layer and corresponding to the patterned photosensitive Si-rich dielectric layer.

* * * * *